(12) United States Patent
Jakobs

(10) Patent No.: US 7,518,935 B2
(45) Date of Patent: Apr. 14, 2009

(54) SYNCHRONOUS RAM MEMORY CIRCUIT

(75) Inventor: Andreas Jakobs, Munich (DE)

(73) Assignee: Infineon Technologies AG, Munich (DE)

( * ) Notice: Subject to any disclaimer, the term of this patent is extended or adjusted under 35 U.S.C. 154(b) by 191 days.

(21) Appl. No.: 11/390,557

(22) Filed: Mar. 27, 2006

(65) Prior Publication Data
US 2006/0233031 A1 Oct. 19, 2006

Related U.S. Application Data

(63) Continuation of application No. PCT/EP2004/010549, filed on Sep. 9, 2004.

(30) Foreign Application Priority Data
Sep. 27, 2003 (DE) ............... 103 44 959

(51) Int. Cl.
G11C 7/10 (2006.01)
G11C 7/22 (2006.01)

(52) U.S. Cl. ............. 365/193; 365/189.05; 365/233.19; 365/233.1

(58) Field of Classification Search ............... 365/233, 365/193, 189.05, 233.1, 233.13, 233.12, 365/233.19, 233.18
See application file for complete search history.

(56) References Cited

U.S. PATENT DOCUMENTS

| 5,896,347 | A | 4/1999 | Tomita et al. |
| 6,198,688 | B1 | 3/2001 | Choi |
| 6,397,312 | B1 | 5/2002 | Nakano et al. |
| 6,621,496 | B1 | 9/2003 | Ryan |
| 2003/0053471 | A1 | 3/2003 | Stief |

OTHER PUBLICATIONS

PCT International Search Report dated Oct. 12, 2004.

*Primary Examiner*—J. H. Hur
(74) *Attorney, Agent, or Firm*—Patterson & Sheridan, L.L.P.

(57) ABSTRACT

One embodiment of the invention relates to a RAM memory circuit. A memory circuit includes a multiplicity of memory cells which can be selectively addressed, I/O circuitry for data; a clock input for receiving a system clock signal; a reception sampling circuit for sampling the received data using a reception strobe signal; and a reception strobe signal generating device which internally generates the reception strobe signal with synchronization with the received system clock signal.

19 Claims, 3 Drawing Sheets

//  SYNCHRONOUS RAM MEMORY CIRCUIT

CROSS-REFERENCE TO RELATED APPLICATIONS

This application is a continuation of co-pending PCT patent application number PCT/EP 2004/010549, filed Sep. 9, 2004, which claims the benefit of German patent application serial number DE 103 44 959.0, filed 27 Sep. 2003. Each of the aforementioned related patent applications is herein incorporated by reference in its entirety.

BACKGROUND OF THE INVENTION

1. Field of the Invention

The invention relates generally to a RAM memory circuit and relates more particularly to devices for sampling the data which are received at the memory circuit.

2. Description of the Related Art

As is known, the acronym RAM stands for Random Access Memory (a read/write memory having direct and random access to the memory cells). Synchronous dynamic RAMs (so-called SDRAMs), particularly those which operate at a "multiplied data rate", as are increasingly being used, for example, as main memories in PCs, are a preferred but not exclusive field of application of the invention.

RAMs are usually operated in conjunction with a controller which provides the RAM with the data which are to be written and receives the data which have been read from the RAM. The controller also provides the address information for selecting those memory cells in the RAM which are to be written to or read from, and also commands for the operating sequences in the RAM. In the case of synchronous RAMs, the controller also provides a system clock signal which is used to synchronize the transmission of addresses and commands and to clock the operations of reading from, and writing to, the memory cells.

The digital data are usually transmitted between a RAM and the associated controller in the form of so-called "bursts" which each comprise a sequence of individual bits or a sequence of individual parallel-bit words, the repetition rate of the data inside the burst being referred to as the "data rate". When the data are received at the RAM (during writing operation) or at the controller (reading operation), the respective arriving data sequence is sampled at a frequency that is equal to the data rate. The strobe signal which is used for this purpose must be matched, not only in terms of its frequency but also in terms of its phase, to the clock of the received data in such a manner that the sampling times are, as much as possible, in the center of the bit periods and are not too close to the bit limits where reliable detection of the valid binary values is no longer guaranteed.

The higher the data rate, the more critical is the synchronization of the strobe signal for data sampling. Relatively recent SDRAMs operate at high data rates which are m times the system clock frequency, m being equal to 2 (i.e., double data rate or so-called DDR operation), 4, 8 or even higher. However, the data are written to, and read from, the memory cells at a slower rate (i.e., rate of the system clock), in each case in parallel to and from m different areas of the cell array, a 1/m multiplexer which is switched at the data rate being used in the SDRAM for the serial/parallel conversion of the data which have been received and for the parallel/serial conversion of the data which have been read, as is generally known.

In RAM/controller systems according to the prior art, a separate data clock signal is generated together with the respective transmission data at the respective transmitting end (controller in writing operation, RAM in writing operation), said data clock signal having a fixed phase relationship with the clock of the transmitted data and being transmitted to the receiving end in parallel with the data via a separate data clock line. This data clock line runs with the data lines in a common line bundle, with the result that virtually no (or only minimal) propagation time differences occur between the data and the data clock signal. At the receiving end, the strobe signal for sampling received data is derived from the received data clock signal.

FIG. 1 of the accompanying drawings schematically shows an example of the devices for synchronized signal transmission between an SDRAM and a controller according to the prior art mentioned above.

FIG. 1 shows parts of a conventional controller module 110 on the left-hand side and parts of a conventional SDRAM module 120 on the right beside said controller module. The two modules which are implemented as integrated circuits on separate chips are designed for reciprocal communication via transmission lines which are indicated by dashed lines in FIG. 1.

The SDRAM 120 shown in FIG. 1 has a plurality of signal connections for communicating with the controller 110, namely: a data connection D having n pins for receiving and transmitting data bursts DAT having a bit width of n from and to an identical data connection D' of the controller 110 via a bundle of n parallel data lines DL; a synchronization signal connection S for receiving and transmitting a data clock signal DTS and DTS' (which specifies the data clock) from and to an identical synchronization signal connection S' of the controller 110 via a data clock line SL; an address input A having a plurality of pins for receiving an item of address information comprising a plurality of parallel bits ADR from an address output A' of the controller 110 via a bundle of address lines AL; a command input B having a plurality of pins for receiving multibit command words BEF from a command output B' of the controller 110 via a bundle of command lines BL; a clock input C for receiving a system clock signal CLK from a clock output C' of the controller 110 via a system clock line C.

In order to synchronize the signals which are transmitted between the controller 110 and the SDRAM 120, transmission sampling circuits and reception sampling circuits are used at the respective connections. Each of these sampling circuits is designed in such a manner that, when a clock edge appears at its sampling control connection (strobe connection), it picks up the binary value of the signal present at the input and provides ("latches") it at the output until the binary value which is then current is "latched" in the same manner with the next clock edge.

During the entire memory operation, the controller 110 transmits the system clock signal CLK, via a transmission amplifier CS and the system clock line CL, to the SDRAM 120 where said signal is amplified in a reception amplifier CE. In the controller 110, a command transmission sampling circuit BS and an address bit transmission sampling circuit AS are respectively used to synchronize the command bits BEF and the address bits ADR with the transmitted system clock signal CLK, and, in the SDRAM 120, a command reception sampling circuit BE and an address bit reception sampling circuit AE are respectively used to resynchronize said command bits and address bits with the system clock signal CLK which has been received there in order to correct any possible propagation time differences between the lines CL, BL and AL.

A command decoder 21 which is contained in the SDRAM 120 decodes the command bits BEF with synchronization by the received system clock signal CLK in order to stimulate individual command lines 22 for executing the respective commands, inter alia a command line AK for executing the activation command for initiating access to the memory cells of the SDRAM, command lines WD and RD for executing the write command ("Write Data") and the read command ("Read Data"), and a command line IN for executing an initialization command at the beginning of memory operation. Stimulating the command line IN opens a mode register 23 for receiving information for setting certain mode parameters, for example the burst length (number of parallel data words in the data bursts) and the CAS latency (number of system clock periods for the waiting time between the activation command and the operation of writing to, or reading from, the memory cells of the SDRAM). The controller 110 applies this setting information, via the address input A of the SDRAM 120, to the mode register 23 during the initialization phase by switching certain address bits to the binary value "1", said setting information causing certain "configuration bits" in this register to be set to "1" in order to provide a bit pattern that prescribes the mode parameters on configuration lines 24 during memory operation.

The memory cells of the SDRAM 120 are diagrammatically shown in FIG. 1 as a block 26, as is the control device 25 for write and read access to the memory cells. The access control device 25 receives the system clock signal CLK, the signals on the command lines 22 and the configuration bits in the mode register 23. The access control device 25 contains address decoders and a switchable network of data paths in order to control the writing of data to, and the reading of data from, the memory cells, as is generally known. Further parts of the SDRAM 120 and also of the controller 110 which interact when data is being transmitted between the two modules are described below in connection with writing operation and reading operation.

During operation, a transmission strobe signal SSS' and SSS which is synchronized with CLK and whose clock edges appear at a repetition rate corresponding to the data rate is respectively generated in both modules 110 and 120 using a clock generator TG' and TG.

Writing Operation:

The data to be written are retrieved at the data rate within the controller 110, for example from the data buffer of the controller (not shown). The data burst which has been retrieved is passed, via the data bus DB', to the data input of a data transmission sampling circuit DS' which samples the data using the transmission strobe signal SSS'. The write data in the controller 110 may likewise be retrieved using the transmission strobe signal SSS' via a line 17. If necessary, a fixed delay may be inserted into said line 17 or into the data bus DB' in order to ensure that the bit limits of the data at the data transmission sampling circuit DS' are at a certain minimum distance from the edges of the strobe signal SSS', and reliable sampling may thus be effected. The write data DAT' which have been sampled are transmitted to the data connection D of the SDRAM 120 via the data lines DL.

In the case of the example shown, the accompanying data clock signal DTS' which is likewise to be transmitted to the SDRAM 120 is generated in such a manner that its edges fall, as much as possible, in the center between the bit limits of the transmitted data. To this end, use is made of a separate transmission sampling circuit SS' which receives a "simulated" bit sequence SBF' which is generated in the controller 110 synchronously with the retrieved data and in which the two binary levels alternate between "0" and "1" from bit to bit. This bit sequence is sampled in the transmission sampling circuit SS' using the strobe signal SSS' in exactly the same way as the data in the transmission sampling circuit DS' and is then delayed in a downstream delay element VG1 by an amount of time τ which is equal to half the period of the data rate. The data clock signal DTS' obtained in this manner is transmitted to the synchronization signal connection S of the SDRAM 120 via the data clock line SL.

In the SDRAM 120, the data burst DAT' which is received at the data connection D is passed to the input of a data reception sampling circuit DE where it is sampled using a reception strobe signal ESS. This signal ESS is derived from the received data clock signal DTS', to be precise using a reception amplifier SE. On account of the delay τ (which has been inserted in the controller) in the data clock signal DTS', the edges of the reception strobe signal ESS that is derived from the latter fall relatively precisely in the center between the bit limits of the data DAT' received at the SDRAM 120. The data reception sampling circuit DE is designed in such a manner that it samples the received data both on the rising edge and on the falling edge of the reception strobe signal ESS. The circuit DE and also the data clock reception amplifier SE are switched on, only during writing operation, by means of a write state signal WRS which is rendered effective by the write command in the control device 25 of the SDRAM 120 and is rendered ineffective by the read command.

The reception data which are sampled in the data reception sampling circuit DE are passed, via the data bus DB, to the access control device 25, from where they are written to the memory cells selected by the address bits ADR.

Reading Operation:

The data which are read from the memory cells (selected by the address bits ADR) during reading operation are retrieved from a data buffer (not shown) in the access control device 25 of the SDRAM 120 at the data rate. The data burst which has been retrieved is passed, via the data bus DB, to the data input of a data transmission sampling circuit DS which samples the read data burst using the transmission strobe signal SSS. The read data may be retrieved via a line 27 using the transmission strobe signal SSS. If necessary, a fixed delay may be inserted into said line 27 or into the data bus DB in order to ensure that the bit limits of the data at the data transmission sampling circuit DS are at a certain minimum distance from the edges of the strobe signal SSS, and reliable sampling may thus be effected. The read data which have been sampled are transmitted to the data connection D' of the controller 110 via the data lines DL.

In the case of the example shown, the accompanying data clock signal DTS which is likewise to be transmitted to the controller 110 is generated in such a manner that its edges coincide exactly with the bit limits of the transmitted data. To this end, use is also made, in the SDRAM 120, of a separate transmission sampling circuit SS which receives a simulated bit sequence SBF which is generated synchronously with the retrieved read data and in which the two binary levels alternate between "0" and "1" from bit to bit. This bit sequence is sampled in the transmission sampling circuit SS using the strobe signal SSS in exactly the same way as the data in the transmission sampling circuit DS of the SDRAM 120. The data clock signal DTS obtained in this manner is transmitted to the synchronization signal connection S' of the controller 110 via the data clock line SL.

In the controller 110, the read data burst DAT received at the data connection D' is passed to the input of a data reception sampling circuit DE' where it is sampled using a reception strobe signal ESS'. This signal ESS' is derived from the received data clock signal DTS, to be precise using a reception amplifier SE' and a downstream delay element VG2 which gives rise to a delay by the amount of time τ, that is to say a delay by half the period of the data rate. The data reception sampling circuit DE' is designed in such a manner that it samples the received read data burst both on the rising edge and on the falling edge of the reception strobe signal ESS'. The circuit DE' and also the data clock reception amplifier SE' are switched on, only during reading operation, by means of a read state signal RDS which is rendered effective in the controller 110 when the read command is sent and is rendered ineffective when the write command is sent.

The read data which have been sampled in the data reception sampling circuit DE' of the controller 110 are forwarded, via the data bus DB', for further processing.

As can be discerned from the explanations above, a bidirectional signal link for the data clock signals when writing and reading is required for data communication between a synchronous RAM and a controller in the prior art. Such a link requires a respective bidirectional port, that is to say an interface having means for changing over between transmission and reception operation, at both ends. In the example described, this interface respectively comprises a transmission sampling circuit SS and SS' and a reception amplifier SE and SE', wherein it is necessary to be able to switch the respective reception amplifier on and off in order to prevent the transmitted data clock signals from being transmitted back into the reception channel. This requires particular circuit and wiring complexity. Another problem with bidirectional signal links is the precise impedance and propagation time matching of the elements in the two interfaces. This matching is particularly important if the transmitted signals, like the data clock signals described, are used as a time base and therefore have to satisfy highly precise time criteria.

SUMMARY OF THE INVENTION

One aspect of the present invention is to design a synchronous RAM in such a manner that it is possible to dispense with bidirectional transmission of clock signals for controlling the sampling of the transmission and reception data at the RAM.

Accordingly, one embodiment of the invention is implemented in a RAM memory circuit containing the following: a multiplicity of memory cells which can be selectively addressed; I/O circuitry for data; a clock input for receiving a system clock signal; a reception sampling circuit for sampling the received data using a reception strobe signal; and a reception strobe signal generating device which internally generates the reception strobe signal with synchronization with the received system clock signal.

Another embodiment of the invention includes a multiplicity of memory cells which can be selectively addressed; a data connection for receiving and transmitting data; an address input for receiving address information for selecting memory cells; a command input for receiving commands; a clock input for receiving a system clock signal; an access control device which responds to the address information and to commands which have been received in order to write the received data to, and read the data to be transmitted from, the memory cells which have been selected using the address information, under the control of the system clock signal; a reception sampling circuit for sampling the received data using a reception strobe signal; a transmission sampling circuit for sampling the data to be transmitted using a transmission strobe signal; a transmission strobe signal generating device which generates the transmission strobe signal with synchronization by the received system clock signal; and a reception strobe signal generating device which internally generates the reception strobe signal with synchronization by the received system clock signal.

Because the reception strobe signal is internally generated in the RAM memory circuit, the need to receive an external data clock signal from the controller is dispensed with. It may still be desirable, merely for reading operations (that is to say when transmitting data to the controller) to also generate an accompanying data clock signal that is synchronous with the sampling of transmitted data and to transmit said data clock signal to the controller. At most, only one unidirectional data clock link is thus required between the RAM and the controller.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Exemplary embodiments are described below with reference to FIGS. 2 and 3.

DETAILED DESCRIPTION OF THE PREFERRED EMBODIMENT

Figure 1:
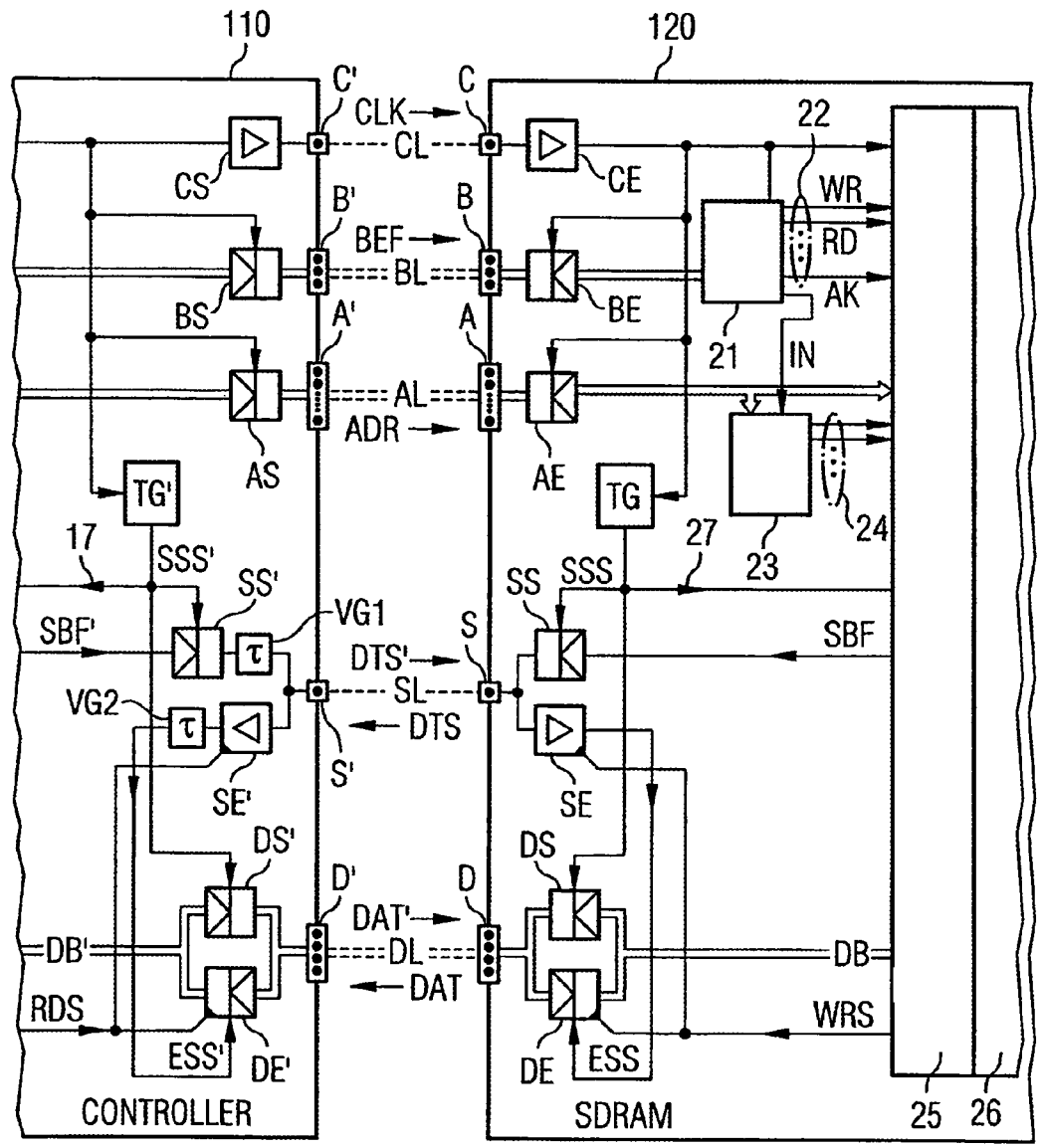
FIG. 1 schematically shows an example of the devices for synchronized signal transmission between an SDRAM and a controller according to the prior art.
Figure 2:
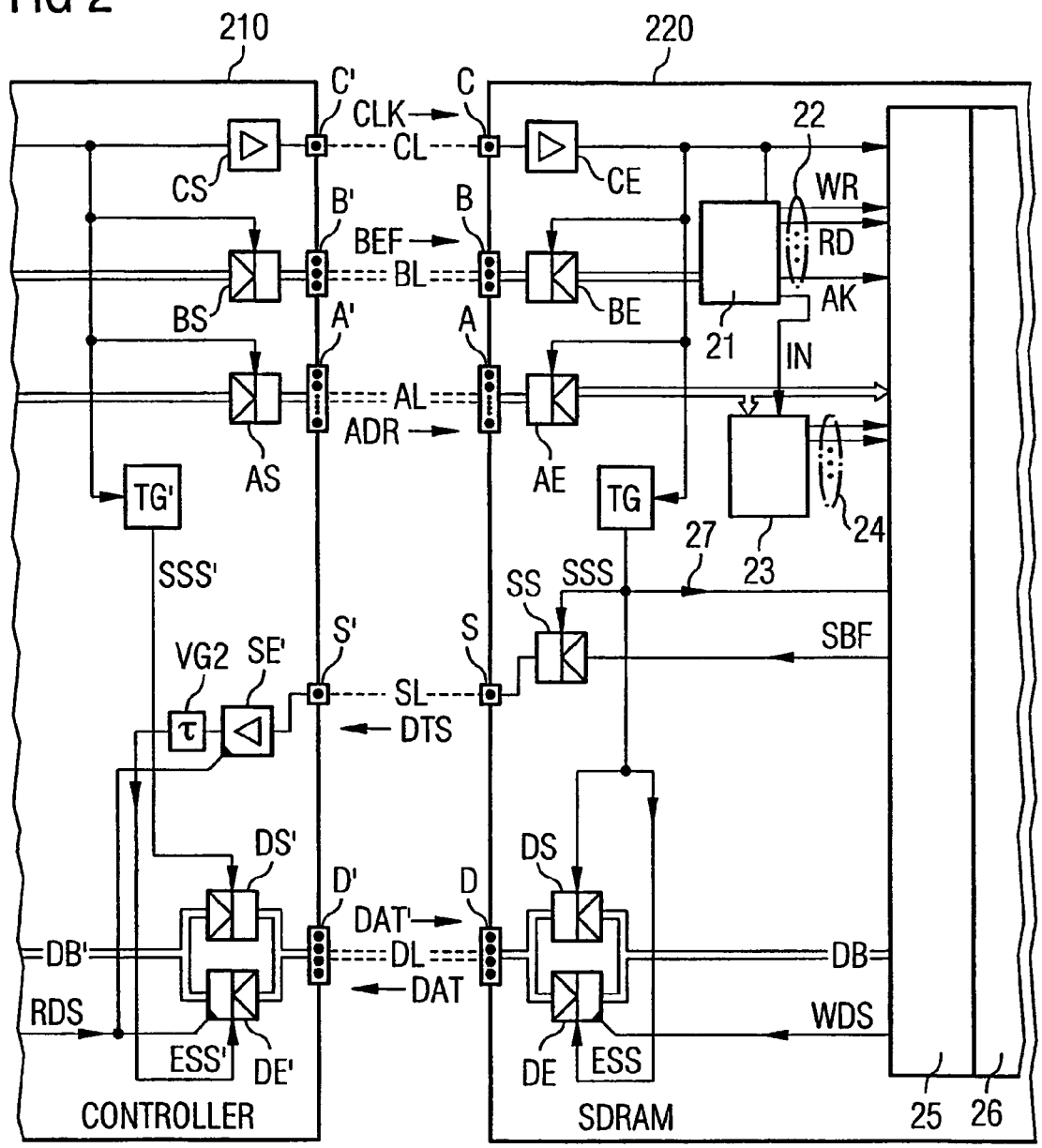
FIG. 2 schematically shows a RAM memory circuit having a configuration according to one embodiment of the invention in conjunction with a controller which is specially adapted to this configuration.
Figure 3:
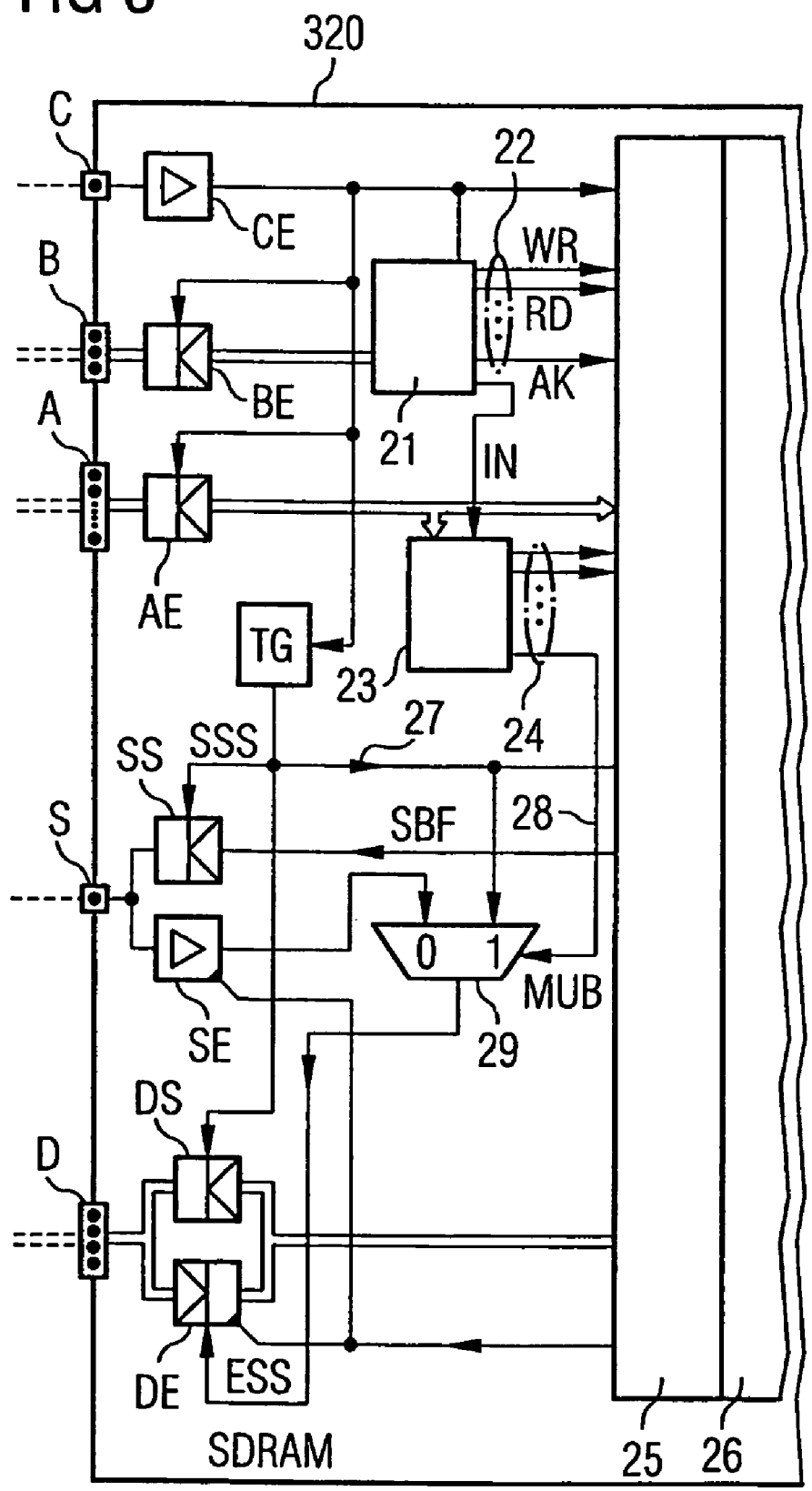
FIG. 3 schematically shows a RAM memory circuit which can be changed over between the configuration according to one embodiment of the invention and a conventional configuration.

The RAM memory circuits 220 and 320 shown as examples in FIGS. 2 and 3 are SDRAMs whose design is similar, in many parts, to the known SDRAM 120 shown in FIG. 1. In FIGS. 2 and 3, the same elements and signals are denoted using the same reference symbols and abbreviations as in FIG. 1. Since details and the nature of these elements and signals have already been described with reference to FIG. 1, only the differences with respect to the circuit arrangement shown in FIG. 1 shall be explained below.

The SDRAM 220 shown in FIG. 2 differs from the known SDRAM 120 shown in FIG. 1 by virtue of the fact that the reception strobe signal ESS for the reception sampling circuit DE for sampling the received data burst DAT' is derived from the received system clock signal CLK, more precisely, in the clock generator TG which is synchronized by said clock signal and whose output signal SSS contains successive clock edges at a repetition rate that is equal to the data rate. This signal SSS which is applied to the transmission sampling circuits SS and DS of the SDRAM during reading operation (as in the known case shown in FIG. 1) is also used, in the case of FIG. 2, as the reception strobe signal ESS during writing operation by being supplied to the input of the reception sampling circuit DE in the SDRAM 220 instead of the data clock signal DTS' that is received with the data in the case of FIG. 1.

It is thus possible to dispense with transmitting a data clock signal from the controller to the SDRAM 220. There is, therefore, no need for bidirectional clock signal transmission for communication between the SDRAM 220 and a controller. The data clock port on the SDRAM 120 therefore needs only the transmission sampling circuit SS and no reception device. The latter can thus be omitted, as shown in FIG. 2.

A controller which communicates with the SDRAM 220 likewise does not need a transmission device for a data clock signal that accompanies the write data, thus reducing the circuit complexity of the controller, as is likewise shown in FIG. 2. On the left, FIG. 2 shows a controller 120 which is specially designed for use with the SDRAM 220. It differs from the conventional controller 110 shown in FIG. 1 by virtue of the fact that the transmission sampling circuit SS' shown in FIG. 1 is missing. That is to say the data clock signal port of the controller 210 is of unidirectional design merely for receiving the data clock signal DTS that is transmitted by the SDRAM 220 during reading operation.

It may be expedient to design a RAM memory circuit in such a manner that it can be operated either with unidirectional data clock transmission from a controller to the RAM, that is to say with data clock transmission only during reading operation, or with bidirectional data clock transmission, that is to say with data clock transmission both during reading operation and during writing operation. Such an option is advantageous in order to also be able to use the RAM without any problems in a conventional operating mode with a conventional controller, for example with the controller 110 shown in FIG. 1.

Accordingly, one particular embodiment of the invention is characterized in that the device for transmitting the data clock signal is part of a bidirectional data clock signal port which also has a device for receiving an external data clock signal which is synchronized with the clock of the received data, and in that provision is made of a changeover device for selectively applying either the internally generated reception strobe signal or a reception strobe signal that is derived from the external data clock signal to the sampling input of the reception sampling circuit.

FIG. 3 shows an SDRAM 320 which can be changed over in the above-described manner. The SDRAM 320 contains all parts of the conventional SDRAM 120 shown in FIG. 1, but the strobe connection of the reception sampling circuit DE can be connected either to the output of the data clock reception sampling circuit or to the output of the internal clock generator TG using a mode changeover switch (multiplexer) 29. The respective switching state of the changeover switch 29 is determined by the binary value of a changeover bit MUB.

In the exemplary embodiment shown, a separate configuration bit in the mode register 23 is used as the mode changeover bit MUB and is applied to the control input of the changeover switch 29 via a line 28. As an example, the mode bit in the mode register 32 is set to "1" for an operating mode with unidirectional data clock transmission and remains set to "0" for the conventional mode with bidirectional data clock transmission.

The SDRAMs 220 and 320 described with reference to FIGS. 2 and 3 and also the relevant controllers may be designed both for single data rate (SDR operation), in which the data are transmitted at the frequency of the system clock, and for operation at a multiplied data rate. In the cases of single and double data rates, the respective internal clock generators TG and TG' may be omitted, and the clock edges of the system clock CLK may be directly used for the respective strobe signal SSS and SSS'. In the case of single data rate, the transmission sampling circuits SS and SS' (and also the circuits for retrieving data) can then be designed in such a manner that sampling is effected only on the falling CLK edges or only on the rising CLK edges. In the case of double data rate, said circuits can be designed in such a manner that sampling is effected both on the falling CLK edges and on the rising CLK edges.

Of course, the invention is not restricted to the embodiments which were described above with reference to the figures and which are merely to be regarded as being examples of possible implementations of the invention. Modifications and other variants of the described circuitry are possible in the context of the idea of the invention. In order to take into account propagation times of signals within the memory circuit, fixed compensating delays may be provided in the various signal paths, said delays not being shown in the drawings for reasons of clarity.

While the foregoing is directed to embodiments of the present invention, other and further embodiments of the invention may be devised without departing from the basic scope thereof, and the scope thereof is determined by the claims that follow.

What is claimed is:

1. A random access memory (RAM) circuit, comprising:
    a plurality of memory cells which can be selectively addressed;
    a data connection for receiving and transmitting data;
    an address input for receiving address information for selecting memory cells;
    a command input for receiving commands;
    a clock input for receiving a system clock signal;
    an access control device which responds to the address information and to the commands which have been received in order to write received data to, and read data to be transmitted from, the memory cells which have been selected using the address information, under the control of the system clock signal;
    a reception sampling circuit for sampling the received data using a reception strobe signal;
    a transmission sampling circuit for sampling the data to be transmitted using a transmission strobe signal;
    a transmission strobe signal generating device which generates the transmission strobe signal with synchronization to the received system clock signal;
    a bidirectional data clock signal port comprising:
        a data clock transmission device for transmitting the transmission strobe signal in parallel with the transmitted data, wherein the transmission strobe signal is synchronized with a clock of the transmitted data; and
        a data clock reception device for receiving an external data clock signal which is synchronized with a clock of the received data; and
    a changeover device for selecting one of:
        the transmission strobe signal; and
        the external data clock signal,
        the changeover device forwarding the selected signal to the reception sampling circuit, the reception sampling circuit using the forwarded signal as the reception strobe signal to sample the received data.

2. The RAM circuit of claim 1, further comprising:
    a programmable mode register for storing a configuration bit provided to the changeover device, wherein the configuration bit is a changeover bit which determines a switching state of the changeover device.

3. The RAM circuit of claim 2, wherein the transmission strobe signal generated by the strobe signal generating device comprises successive clock edges at a repetition rate that is equal to the data rate.

4. The RAM circuit of claim 1, wherein the transmission strobe signal generated by the strobe signal generating device comprises successive clock edges at a repetition rate that is equal to the data rate.

5. A memory circuit, comprising:
    a plurality of memory cells which can be selectively addressed;
    an access control device configured to selectively write received data to the plurality of memory cells and read stored data from the plurality of memory cells;
    a clock input for receiving a system clock signal;
    a reception sampling circuit for sampling received data to be written to the plurality of memory cells, wherein the reception sampling circuit is configured to utilize a reception strobe signal; and
a changeover device for selecting one of:
  a transmission strobe signal derived from the received system clock signal; and
  an external data clock signal. the changeover device forwarding the selected signal to the reception sampling circuit, the reception sampling circuit using the forwarded signal as the reception strobe signal to sample the received data.

6. The memory circuit of claim 5, further comprising:
a transmission sampling circuit configured to utilize the transmission strobe signal for sampling data read from selected memory cells to be transmitted; and
a transmission strobe signal generating device which generates the transmission strobe signal based on the received system clock signal.

7. The memory circuit of claim 6, further comprising:
a data clock signal transmission device for transmitting a data clock signal in parallel with the transmitted data, wherein the data clock signal is synchronized with a clock of the transmitted data.

8. The memory circuit of claim 7, further comprising:
a bidirectional data clock signal port comprising:
  the data clock transmission device for transmitting the data clock signal; and
  a data clock reception device for receiving the external data clock signal which is synchronized with a clock of the received data.

9. The memory circuit of claim 5, further comprising:
a programmable mode register for storing a configuration bit provided to the changeover device, wherein the configuration bit is a changeover bit which determines a switching state of the changeover device.

10. The memory circuit of claim 9, wherein the changeover device comprises a multiplexer.

11. A memory system, comprising:
a memory controller and a memory circuit,
wherein the memory controller comprises:
  a clock signal output for providing a system clock signal;
  a bi-directional data connection for communicating data with the memory circuit; and
  a data clock signal connection for receiving a data clock signal from the memory circuit;
wherein the memory circuit comprises:
  a plurality of memory cells which can be selectively addressed;
  an access control device configured to selectively write received data to the plurality of memory cells and read stored data from the plurality of memory cells;
  a clock input for receiving the system clock signal from the memory controller;
  a reception sampling circuit for sampling data, received from the memory controller, to be written to the plurality of memory cells, wherein the reception sampling circuit is configured to utilize a reception strobe signal; and
  a changeover device for selecting one of:
    a transmission strobe signal derived from the received system clock signal; and
    an external data clock signal, the changeover device forwarding the selected signal to the reception sampling circuit, the reception sampling circuit using the forwarded signal as the reception strobe signal to sample the received data.

12. The memory system of claim 11, wherein the memory circuit further comprises:
a transmission sampling circuit configured to utilize the transmission strobe signal for sampling data read from selected memory cells to be transmitted; and
a transmission strobe signal generating device which generates the transmission strobe signal based on the received system clock signal.

13. The memory system of claim 12, wherein the memory circuit further comprises:
a data clock signal transmission device for transmitting the data clock signal in parallel with the transmitted data, wherein the data clock signal is synchronized with a clock of the transmitted data.

14. The memory system of claim 13, wherein the data clock signal connection in the memory controller is uni-directional.

15. The memory system of claim 13, wherein the memory circuit further comprises:
a bi-directional data clock signal port comprising:
  the data clock transmission device for transmitting the data clock signal; and
  a data clock reception device for receiving the external data clock signal which is synchronized with a clock of the received data.

16. The memory system of claim 15, wherein the memory controller further comprises a write data clock signal device for transmitting the external data clock signal to the memory circuit and wherein the data clock signal connection in the memory controller is bi-directional.

17. The memory system of claim 11, wherein the memory circuit further comprises:
a programmable mode register for storing a configuration bit provided to the changeover device, wherein the configuration bit is a changeover bit which determines a switching state of the changeover device.

18. The memory system of claim 17, wherein the changeover device of the memory circuit comprises a multiplexer.

19. A random access memory (RAM) circuit, comprising:
a plurality of memory cells which can be selectively addressed;
a data connection for receiving data to be written to the memory cells and transmitting data read from the memory cells;
a clock input for receiving a system clock signal;
a reception sampling circuit for sampling the received data at the data connection using an internally-generated reception strobe signal; and
a changeover device for selecting one of:
  a transmission strobe signal derived from the received system clock signal; and
  an external data clock signal. the changeover device forwarding the selected signal to the reception sampling circuit, the reception sampling circuit using the forwarded signal as the reception strobe signal to sample the received data.

* * * * *